United States Patent [19]
Ohkura et al.

[11] Patent Number: 5,887,011
[45] Date of Patent: Mar. 23, 1999

[54] SEMICONDUCTOR LASER

[75] Inventors: Yuji Ohkura; Motoharu Miyashita; Shoichi Karakida, all of Tokyo, Japan

[73] Assignee: Mitsubishi Denki Kabushiki Kaisha, Tokyo, Japan

[21] Appl. No.: 801,144

[22] Filed: Feb. 18, 1997

[30]  Foreign Application Priority Data

Sep. 25, 1996  [JP]  Japan .................................... 8-253540

[51] Int. Cl.⁶ ....................................................... H01S 3/19
[52] U.S. Cl. ................................................. 372/46; 372/45
[58] Field of Search ........................................ 372/46, 45

[56]  References Cited

U.S. PATENT DOCUMENTS

| | | | |
|---|---|---|---|
| 5,210,767 | 5/1993 | Arimoto et al. ........................... | 372/46 |
| 5,303,255 | 4/1994 | Kudo et al. ................................ | 372/46 |
| 5,361,271 | 11/1994 | Takiguchi et al. ......................... | 372/46 |
| 5,386,429 | 1/1995 | Naito et al. ................................ | 372/46 |
| 5,528,617 | 6/1996 | Kobayashi et al. ........................ | 372/46 |

FOREIGN PATENT DOCUMENTS

| | | | |
|---|---|---|---|
| 63-177488 | 7/1988 | Japan ......................................... | 372/46 |
| 5 67841 | 3/1993 | Japan . | |

Primary Examiner—Rodney B. Bovernick
Assistant Examiner—Yisun Song
Attorney, Agent, or Firm—Leydig, Voit & Mayer, Ltd.

[57]  ABSTRACT

A semiconductor laser includes a first conductivity type GaAs substrate; a AlGaAs double heterojunction structure disposed on the GaAs substrate and including an upper cladding layer having a mesa ridge stripe with a side surface that makes an angle larger than 90° with a front surface of the upper cladding layer; a first current blocking layer of first conductivity type AlGaAs; and a second current blocking layer of first conductivity type AlGaAs, the first and second current blocking layers covering the mesa ridge stripe. The Al compositions of the first and second current blocking layers are larger than that of the upper cladding layer, maintaining an equivalent refractive index of an active region higher than that of other portions of the semiconductor laser. As a result, the differences between the lattice constant of the second current blocking layer and the GaAs substrate or the AlGaAs upper cladding layer are smaller than in prior art semiconductor lasers. Since the second current blocking layer is in the vicinity of the active region in the mesa ridge stripe, stress applied to the active region is reduced, thereby producing a semiconductor laser that facilitates ridge width control and burying layer growth, and with improved reliability.

4 Claims, 7 Drawing Sheets

Fig.4 (a) thickness of n-AlGaAs blocking layer 0.8 μm
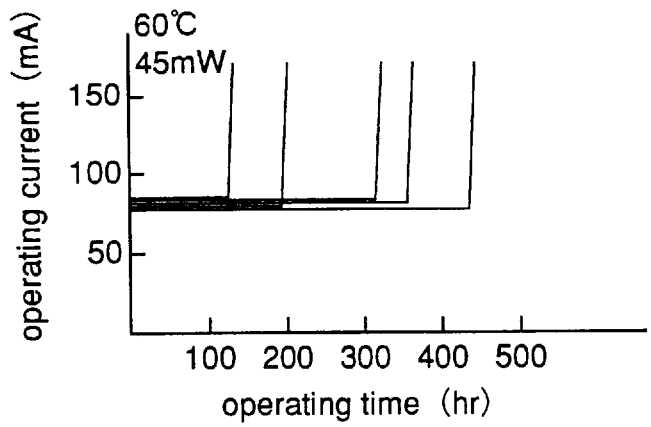
Fig.4 (b) thickness of n-AlGaAs blocking layer 0.6 μm
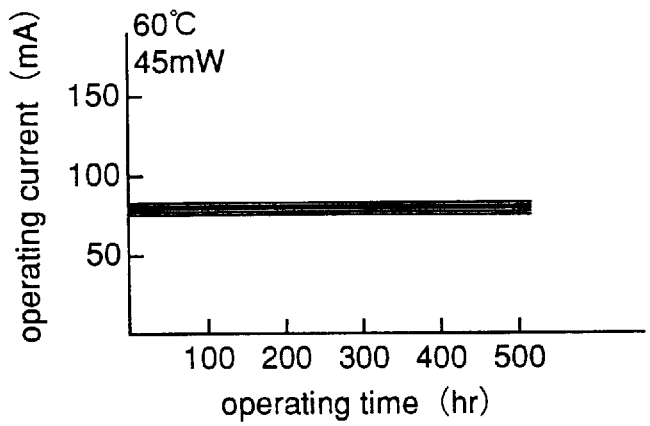
Fig.5
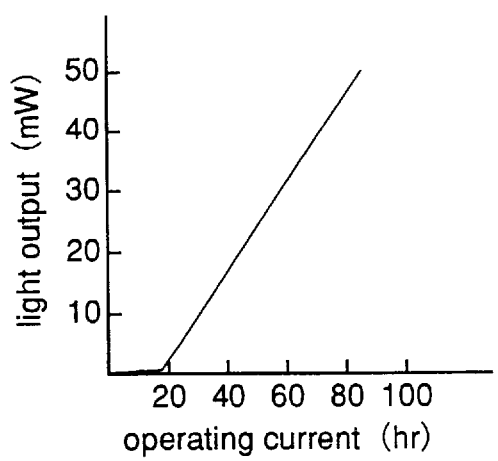

SEMICONDUCTOR LASER

FIELD OF THE INVENTION

The present invention relates to a semiconductor laser and a fabricating method thereof and, more particularly, to a real refractive index type semiconductor laser which facilitates ridge width control and burying growth and improves reliability, and has high reliability at high output power operation, and a fabricating method thereof.

BACKGROUND OF THE INVENTION

FIG. 6 is a cross-sectional view illustrating a prior art forward-mesa ridge type 0.78 μm wavelength semiconductor laser having a real refractive index guided structure (hereinafter referred to as forward-mesa ridge type semiconductor laser). In the figure, reference numeral 1 designates an n type GaAs substrate. An n type $Al_xGa_{1-x}As$ (x=0.48) lower cladding layer 2 having a thickness of about 1.5 μm is disposed on the n type GaAs substrate 1. An AlGaAs quantum-well active layer 3 is disposed on the lower cladding layer 2. A p type $Al_xGa_{1-x}As$ (x=0.48) upper cladding layer 4 having a thickness of about 1.5 μm is disposed on the quantum-well active layer 3, and the upper cladding layer 4 includes a mesa ridge stripe 4a. An n type $Al_xGa_{1-x}As$ (x=0.70) current blocking layer 6 having a thickness of about 1.5 μm is disposed adjacent both sides of the mesa ridge stripe 4a. A p type GaAs contact layer 5 having a thickness of about 3 μm is disposed on the upper cladding layer 4 and the current blocking layer 6. A stripe-shaped p side electrode 11 is disposed on the contact layer 5 over the mesa ridge stripe 4a, and an n side electrode 12 is disposed on a rear surface of the substrate 1.

FIGS. 7(a)–7(d) are cross-sectional views illustrating process steps in a method of fabricating the forward-mesa ridge type semiconductor laser. In these figures, the same reference numerals as shown in FIG. 6 designate the same or corresponding parts. Reference numeral 8 designates a selective growth mask. The fabricating method will be described below.

As shown in FIG. 7(a), the lower cladding layer 2, the active layer 3 and the upper cladding layer 4 are successively grown on the substrate 1 by MOCVD (metal organic chemical vapor deposition) to form a double heterojunction structure.

After an SiN layer is formed on the upper cladding layer 4, patterning is performed by conventional lithography to form the SiN mask 8. Then, using the SiN mask 8 as a mask, portions of the upper cladding layer 4, except for an active region 7, are etched to have a thickness of 0.1 to 0.4 μm, thereby forming the mesa ridge stripe 4a (FIG. 7(b)).

As shown in FIG. 7(c), the current blocking layer 6 is grown by MOCVD on the upper cladding layer 4 to cover both sides of the mesa ridge stripe 4a.

As shown in FIG. 7(d), after removing the SiN mask 8, the contact layer 5 is grown on the mesa ridge stripe 4a and the current blocking layer 6. Finally, the p side electrode 11 is formed on the contact layer 5 and the n side electrode 12 is formed on the rear surface of the substrate 1, completing the semiconductor laser.

As described above, in the prior art forward-mesa ridge type semiconductor laser, the n type $Al_xGa_{1-x}As$ (x=0.70) current blocking layer 6 having a refractive index smaller than that of the upper cladding layer 4 is disposed adjacent both sides of the mesa ridge stripe 4a of the upper cladding layer 4. Therefore, a current is efficiently concentrated in the active region 7. Further, since an equivalent refractive index of the active region 7 is higher than that of other portions of the semiconductor laser, light emitted from the active region 7 is efficiently confined in the active region 7. Consequently, laser oscillation is produced at a low current density.

FIG. 8 is a cross-sectional view illustrating a prior art reverse-mesa ridge type semiconductor laser. The reverse-mesa ridge type semiconductor laser is fundamentally identical to the forward-mesa ridge type semiconductor laser, except that the mesa ridge stripe 4a has a reverse mesa shape. The forward-mesa ridge type semiconductor laser has advantages over the reverse-mesa ridge type semiconductor laser in that the side etching is less and the ridge width is more easily controlled when the mesa ridge stripe is formed, and that the current blocking layer 6 is more easily buried.

In the prior art forward-mesa and reverse-mesa ridge type semiconductor lasers, however, because the current blocking layer 6 having a lattice constant larger than those of the substrate 1 and the upper cladding layer 4 is formed in the vicinity of the active region 7, stress is applied to the active region 7, so that crystalline defects due to the stress tend to be produced. Especially in the forward-mesa ridge type semiconductor laser, since the current blocking layer 6 is close to the active region 7, as compared with the reverse-mesa ridge type semiconductor laser, it is impossible to ensure the reliability of the semiconductor laser. Consequently, in order to prevent deterioration of reliability due to the stress applied to the active region 7 while maintaining the advantages of facilitation of the ridge width control and the burying growth, it is necessary to adopt the forward-mesa ridge stripe structure for a semiconductor laser and not to form a current blocking layer having a large Al composition in the vicinity of the active region 7.

In addition, in the prior art forward-mesa ridge type semiconductor laser, the current blocking layer 6 comprises n type AlGaAs semiconductor having a large Al composition. In the n type AlGaAs semiconductor having a large Al composition, it is difficult to dope the AlGaAs semiconductor with an n type dopant impurity, and it is impossible to make its n type carrier concentration high. Therefore, in order to satisfactorily exhibit the current blocking effect, the thickness of the current blocking layer 6 must be not less than 1 μm. For this reason, its thickness is 1.5 μm. Therefore, as the current blocking layer 6 becomes thicker, the stress applied to the active region 7 is increased, whereby the reliability of the semiconductor laser is deteriorated. Consequently, in the prior art forward-mesa ridge type semiconductor laser, high output power operation and high reliability of the laser are incompatible with each other.

SUMMARY OF THE INVENTION

It is an object of the present invention to provide a semiconductor laser which facilitates ridge width control and burying growth and improves reliability, and has high reliability even at high output power operation. It is another object of the present invention to provide a method of fabricating the semiconductor laser.

Other objects and advantages of the present invention will become apparent from the detailed description given hereinafter; it should be understood, however, that the detailed description and specific embodiment are given by way of illustration only, since various changes and modifications within the scope of the invention will become apparent to those skilled in the art from this detailed description.

According to a first aspect of the present invention, a semiconductor laser comprises an upper cladding layer included in a double heterojunction structure of AlGaAs disposed on a conductive type GaAs substrate, and including a mesa ridge stripe having a side surface that makes an angle larger than 90° with a front surface of the upper cladding layer, a conductive type AlGaAs first current blocking layer having an Al composition of 0.60 to 0.80 and disposed on the front surface of the upper cladding layer, and a conductive type AlGaAs second current blocking layer having an Al composition of 0.40 to 0.55 and disposed on the side surface of the mesa ridge stripe of the upper cladding layer. Taking into consideration that an equivalent refractive index of an active region is maintained greater than that of other portions of the semiconductor laser, the Al composition of the first current blocking layer is selected so as to be larger than that of the upper cladding layer, and the Al composition of the second current blocking layer is selected so as to be larger than that of the upper cladding layer. As a result, the differences between a lattice constant of the second current blocking layer and that of the GaAs substrate or the AlGaAs upper cladding layer are smaller than in the prior art semiconductor laser. By disposing the above second current blocking layer in the vicinity of the active region in the mesa ridge stripe, stress applied to the active region is reduced, thereby obtaining a semiconductor laser that facilitates ridge width control and burying growth and improves reliability.

According to a second aspect of the present invention, the above semiconductor laser is characterized in that an n type GaAs substrate is used as the conductive type GaAs substrate; a first n type current blocking layer having a thickness of 0.3 to 0.6 $\mu$m is disposed on the front surface of the upper cladding layer; a second n type current blocking layer having a prescribed thickness is disposed on the side surface of the mesa ridge stripe of the upper cladding layer; and a third n type GaAs current blocking layer is disposed on the first n type current blocking layer on both sides of the mesa ridge stripe having the second current blocking layer at the side surface. Therefore, the first, second and third current blocking layers are used as current blocking layers, and the first current blocking layer having a larger lattice constant than the prior art is partly substituted for the third current blocking layer having a smaller lattice constant than the prior art. Hence the stress applied to the active region is reduced, whereby the reliability of the forward-mesa ridge type semiconductor laser is further improved. Further, the third current blocking layer does not contain Al, enabling to increase an n type carrier concentration. Thus by increasing the carrier concentration of the third current blocking layer, satisfactory current blocking effect is obtained. Furthermore, the thickness of the first current blocking layer is 0.3 to 0.6 $\mu$m, so that the reliability of the semiconductor laser can be improved, holding a state in which the equivalent refractive index of the active region is higher than that of other portions of the semiconductor laser. Consequently, it is obtainable a forward-mesa ridge type semiconductor laser that exhibits satisfactory current blocking effect even at high output power operation, leading to its operation at low driving current and high reliability.

According to a third aspect of the present invention, in the semiconductor laser of the second aspect, the third current blocking layer has a thickness not less than 0.3 $\mu$m. Therefore, it is obtainable a forward-mesa ridge type semiconductor laser that has satisfactory current blocking effect even at high output power operation.

According to a fourth aspect of the present invention, a method of fabricating a semiconductor laser includes forming a double heterojunction structure comprising AlGaAs on a front surface of a conductive type GaAs substrate, i.e., a (001) surface, by crystal growth using MOCVD; selectively etching an upper cladding layer of the double heterojunction structure to form a mesa ridge stripe having a side surface that makes an angle larger than 90° with a front surface formed by the etching, in a <1$\bar{1}$0> direction of the upper cladding layer; and forming a first current blocking layer of the conductive type AlGaAs having a larger Al composition than that of the upper cladding layer on the front surface of the upper cladding layer formed by the etching, and a second current blocking layer of the conductive type AlGaAs having an Al composition smaller than that of the first current blocking layer and larger than that of the upper cladding layer on the side surface of the mesa ridge stripe formed by the etching, by utilizing the feature that the Al compositions of the AlGaAs layers grown on the respective crystal surfaces differ depending on the directions of the crystal surfaces in the crystal growth by MOCVD. This enables to simultaneously form the first current blocking layer and the second current blocking layer which differ from each other in Al composition. It is possible to fabricate a forward-mesa ridge type semiconductor laser in which stress applied to an active region is reduced, without complicated processes.

BRIEF DESCRIPTION OF THE DRAWINGS

FIGS. 4($a$) and 4($b$) are graphs each showing a relation between a thickness of the n type AlGaAs first current blocking layer and reliability of the semiconductor laser, where FIG. 4($a$) is a graph showing the results of measurements of operating current and operating time when the thickness of the n type AlGaAs first current blocking layer is 0.6 $\mu$m, and FIG. 4($b$) is a graph showing the results of measurements of operating current and operating time when the thickness of the n type AlGaAs first current blocking layer is 0.8 $\mu$m.

FIG. 5 is a graph showing the results of measurements of light output and operating current when the thickness of an n type GaAs third current blocking layer is 0.3 $\mu$m.

DETAILED DESCRIPTION OF THE PREFERRED EMBODIMENTS

[Embodiment 1]

Figure 1:
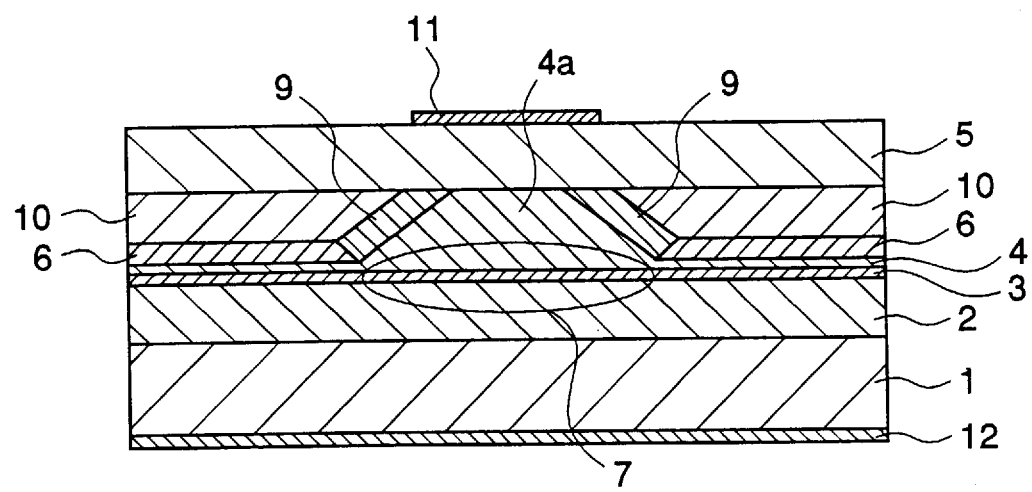
FIG. 1 is a cross-sectional view illustrating a forward-mesa ridge type semiconductor laser in accordance with a first embodiment of the present invention.

FIG. 1 is a cross-sectional view illustrating a forward-mesa ridge type semiconductor laser according to a first embodiment of the present invention. In the figure, reference numeral 1 designates an n type GaAs substrate with a (001) surface at a front surface. An n type $Al_xGa_{1-x}As$ (x=0.48) lower cladding layer 2 having a thickness of about 1.5 $\mu$m is disposed on the front surface of the n type GaAs substrate 1. An AlGaAs quantum-well active layer 3 having a thickness of 0.1 μm is disposed on the lower cladding layer 2. A p type $Al_xGa_{1-x}As$ (x=0.48) upper cladding layer 4 having a thickness of about 1.5 μm is disposed on the quantum-well active layer 3, and the upper cladding layer 4 includes a mesa ridge stripe 4a with an <1$\bar{1}$0> ridge stripe direction, which is generally called the forward-mesa direction, and with a (111)A surface at a side surface. An n type $Al_xGa_{1-x}As$ (x=0.70) first current blocking layer 6 having a thickness of 0.3 μm is disposed on a front surface of the upper cladding layer 4, i.e., the (001) surface. An n type $Al_xGa_{1-x}As$ (x=0.50) second current blocking layer 9 is disposed on the side surface of the mesa ridge stripe 4a, i.e., the (111)A surface, of the upper cladding layer 4, and the second current blocking layer 9 has a thickness approximately equal to the thickness of the first current blocking layer 6 in the side surface direction and a low Al composition. An n type GaAs third current blocking layer 10 having a thickness of 1.2 μm and a carrier concentration of $5\times10^{18}$ $cm^3$ is disposed on the first current blocking layer 6 on both sides of the mesa ridge stripe 4a having the second current blocking layer 9 at the side surface. A p type GaAs contact layer 5 having a thickness of about 3 μm is disposed on the upper cladding layer 4, the second current blocking layer 9 and the third current blocking layer 10. A stripe-shaped p side electrode 11 is disposed on the contact layer 5 over the mesa ridge stripe 4a, and an n side electrode 12 is disposed on a rear surface of the substrate 1. The AlGaAs quantum-well active layer 3 comprises an $Al_xGa_{1-x}As$ (x=0.35) barrier layer having a thickness of 0.030 μm, an alternately laminated layer comprising three $Al_xGa_{1-x}As$ (x=0.10) well layers each having a thickness of 0.008 μm and two $Al_xGa_{1-x}As$ (x=0.35) barrier layers each having a thickness of 0.008 μm that are alternately laminated, and an $Al_xGa_{1-x}As$ (x=0.35) barrier layer having a thickness of 0.030 μm, where the barrier layer, the laminated layer and the barrier layer are successively laminated. The p side electrode 11 is made of AuZn/Ti/Au, and the n side electrode 12 is made of AuGe/Ni/Au.

The Al composition x of the n type $Al_xGa_{1-x}As$ first current blocking layer 6 can be selected from the range of 0.60 to 0.80 so as to be larger than the Al composition of the upper cladding layer 4, taking into consideration that an equivalent refractive index of the active region 7 is maintained greater than that of other portions of the semiconductor laser. Preferably, the Al composition x of the n type $Al_xGa_{1-x}As$ second current blocking layer 9 is close to that of the p type $Al_xGa_{1-x}As$ upper cladding layer 4, and it can be selected from the range of 0.40 to 0.55 so as to be larger than the Al composition of the upper cladding layer 4, in consideration of the stress applied to the active region 7 and its equivalent refractive index as previously described. The thickness of the first current blocking layer 6 can be set in the range of 0.3 to 0.6 μm, and that of the n type GaAs third current blocking layer 10 may be not less than 0.3 μm, both of which will be described later. The substrate 1 may have a surface equivalent to the (001) surface as the front surface.

FIGS. 2(a)–2(d) are cross-sectional views illustrating process steps in a method of fabricating the above forward-mesa ridge type semiconductor laser. In these figures, the same reference numerals as shown in FIG. 1 designate the same or corresponding parts. Reference numeral 8 designates an SiN selective growth mask.

A description is given of the fabricating method.

Figure 2:
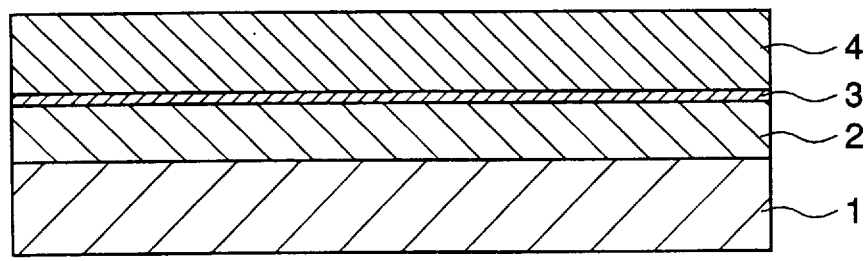
FIGS. 2($a$)–2($d$) are cross-sectional views illustrating process steps in a method of fabricating a forward-mesa ridge type semiconductor laser according to the first embodiment of the invention.
Figure 2:
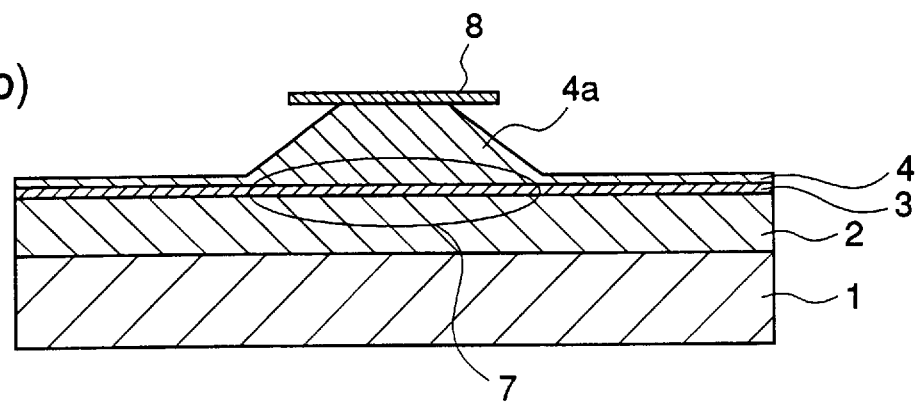
Figure 2:
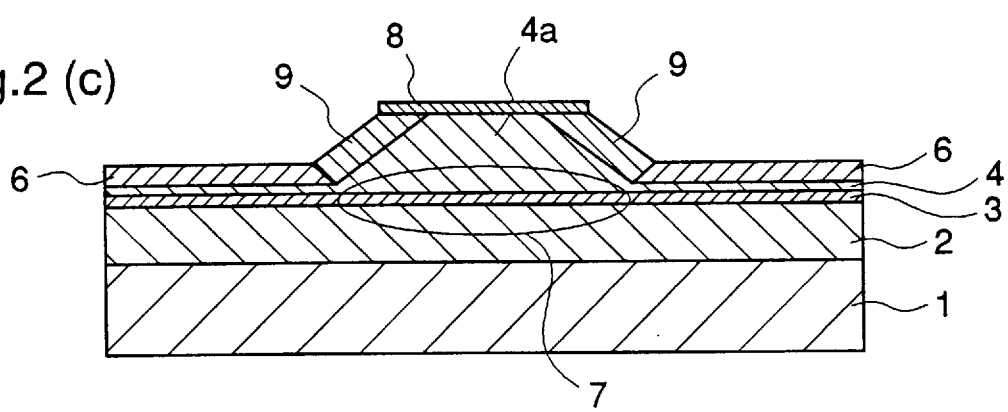
Figure 2:
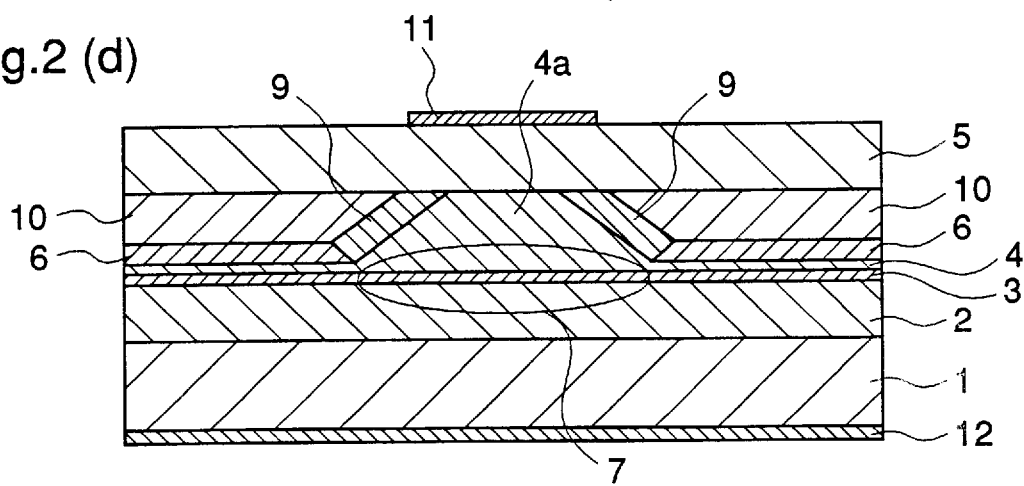

As shown in FIG. 2(a), using the substrate 1 with a (001) surface at the front surface, the lower cladding layer 2, the active layer 3, and the upper cladding layer 4 are successively grown by MOCVD on the front surface of the substrate 1 to form a double heterojunction structure.

As shown in FIG. 2(b), after an SiN layer is formed on the upper cladding layer 4, a patterning is performed by conventional lithography to form the SiN mask 8. Then, using the SiN mask 8 as a mask, portions of the upper cladding layer 4, except for an active region 7, are etched to have a thickness of 0.1 to 0.4 μm, thereby forming the mesa ridge stripe 4a with a (111)A surface at the side surface in the <1$\bar{1}$0> direction of the upper cladding layer 4.

As shown in FIG. 2(c), using the SiN mask 8 as a mask, the n type $Al_xGa_{1-x}As$ first current blocking layer 6 having an Al composition x of 0.70 is grown by MOCVD on the front surface of the upper cladding layer 4, i.e., the (001) surface, and, simultaneously, the n type $Al_xGa_{1-x}As$ second current blocking layer 9 having an Al composition x of 0.50 is grown by MOCVD on the side surface of the mesa ridge stripe 4a, i.e., the (111)A surface, at the optimum growth temperature and the optimum HCl gas flow.

As shown in FIG. 2(d), the n type GaAs third current blocking layer 10 is grown on the first current blocking layer 6 to cover both sides of the mesa ridge stripe 4a with the second current blocking layer 9 formed on the side surface. Subsequently, after removing the SiN mask 8, the contact layer 5 is grown on the mesa ridge stripe 4a, the second current blocking layer 9 and the third current blocking layer 10. Finally, the p side electrode 11 is formed on the contact layer 5 and the n side electrode 12 is formed on the rear surface of the substrate 1, completing the forward-mesa ridge type semiconductor laser.

Figure 3:
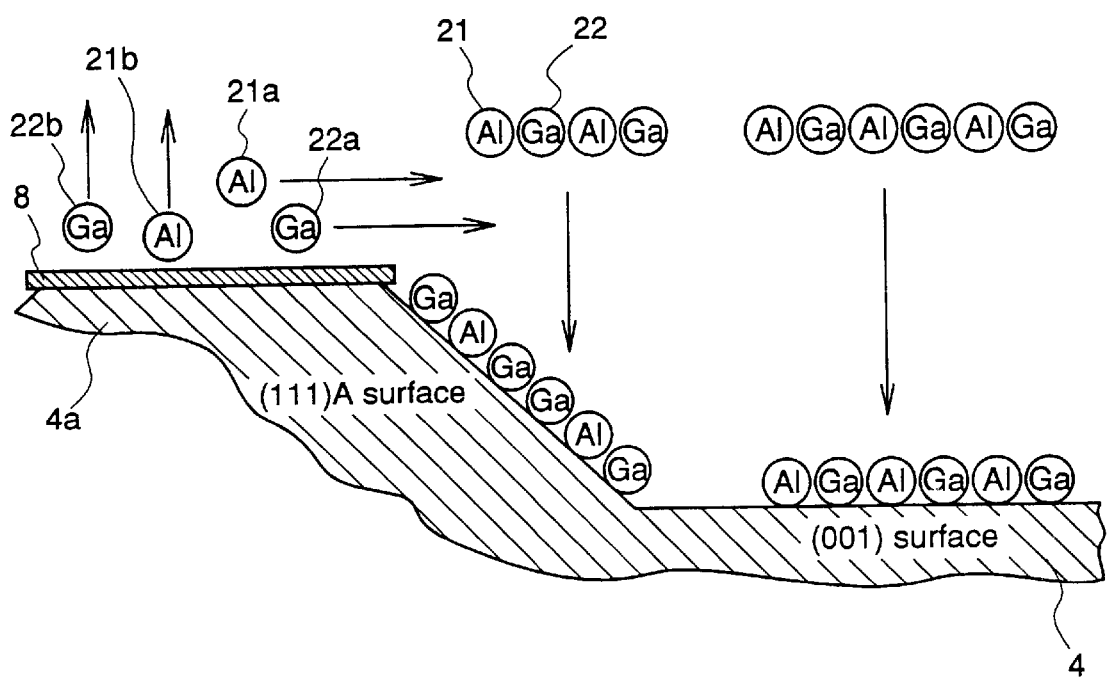
FIG. 3 is a diagram for explaining the principle of simultaneously growing a first current blocking layer and a second current blocking layer, which differ from each other in Al composition, on an upper cladding layer.
Figure 6:
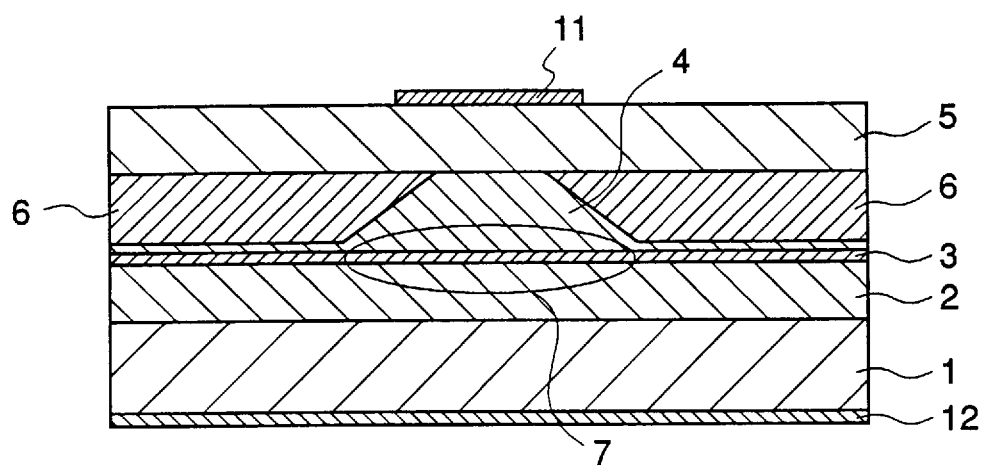
FIG. 6 is a cross-sectional view illustrating a prior art forward-mesa ridge type semiconductor laser.
Figure 7:
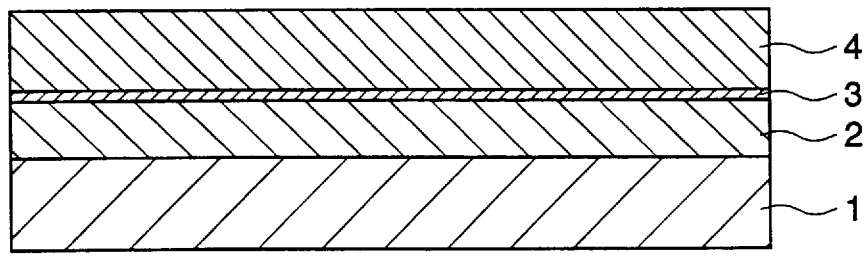
FIGS. 7($a$)–7($d$) are cross-sectional views illustrating process steps in a prior art method of fabricating a forward-mesa ridge type semiconductor laser.
Figure 7:
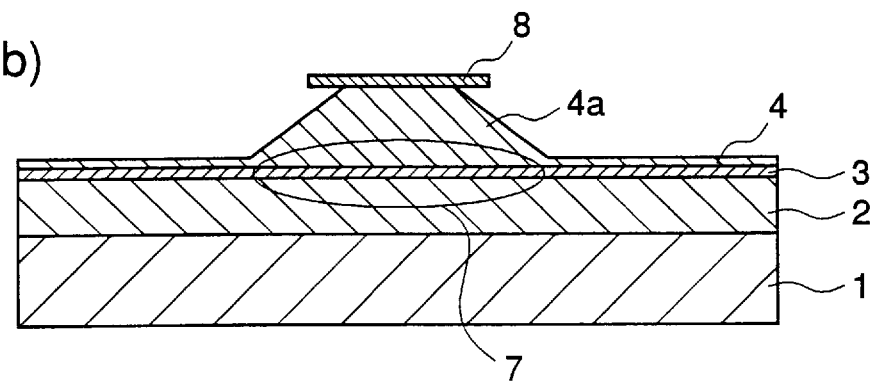
Figure 7:
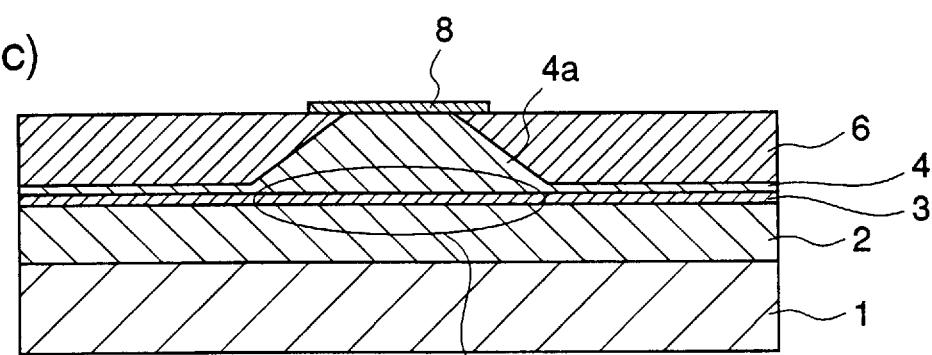
Figure 7:
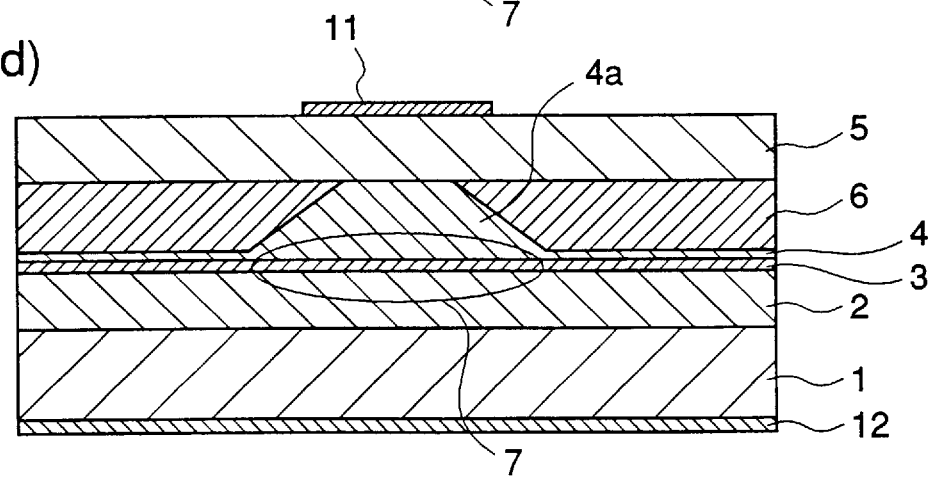
Figure 8:
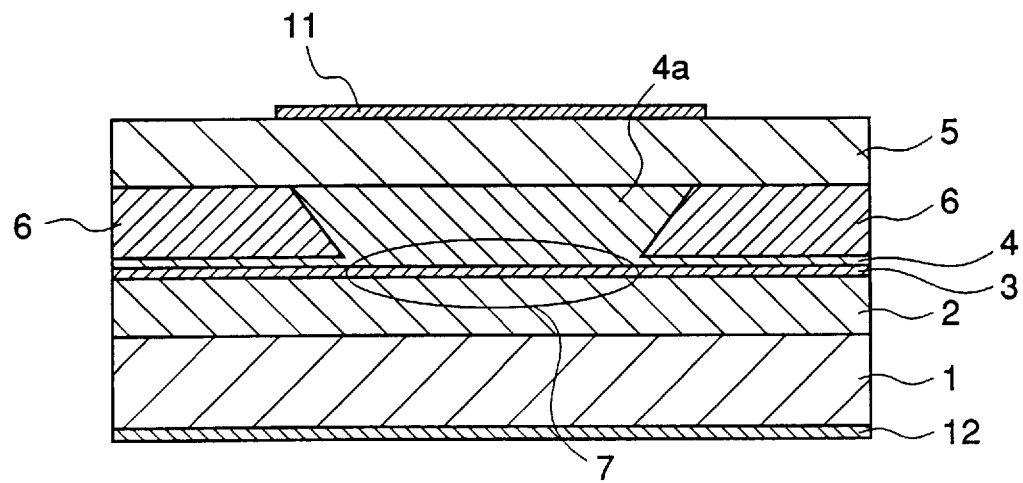
FIG. 8 is a cross-sectional view illustrating a prior art reverse-mesa ridge type semiconductor laser.

FIG. 3 is a diagram for explaining the principle of simultaneously growing, on the upper cladding layer 4, the first current blocking layer 6 and the second current blocking layer 9 which differ from each other in Al composition, in the above fabricating method. In the figure, the same reference numerals as shown in FIGS. 2(a)–2(d) designate the same or corresponding parts. Reference numeral 21 designates an Al atom, and numeral 22 designates a Ga atom. The Al atoms 21 and the Ga atoms 22 supplied to the front surface of the upper cladding layer 4, i.e., the (001) surface, are deposited on a wafer (the upper cladding layer 4). The Al atoms 21 and the Ga atoms 22 supplied to the side surface of the mesa ridge stripe 4a, i.e., the (111)A surface, are deposited on the wafer. However, the Al atoms 21a and the Ga atoms 22a supplied to the SiN mask 8 cannot remain on the SiN mask 8, so that these atoms diffuse and reach the (111)A surface to be grown there.

Of the Group III atoms supplied to the SiN mask 8, i.e., the Al atoms and Ga atoms, the atoms 21a and 22a diffuse to the (111)A surface, and the atoms 21b and 22b return into a gaseous phase. The contribution of the above Group III atoms to the growth on the (111)A surface of the mesa ridge stripe 4a vary depending on growth conditions, such as growth temperature and pressure, and generally depending on the kinds of atoms.

In addition, the HCl gas added to the material gas promotes the diffusion of the Group III atoms, such as Al and Ga.

Accordingly, the second current blocking layer 9 grown on the (111)A surface of the mesa ridge stripe 4a of the upper cladding layer 4 is different in Al composition from the first current blocking layer 6 grown on the (001) surface of the upper cladding layer 4. Consequently, it is possible to simultaneously grow the first current blocking layer 6 and the second current blocking layer 9 which differ from each other in Al composition, on the upper cladding layer 4. Further, by selecting the growth conditions, the Al composition of the second current blocking layer 9 grown on the (111)A surface can be controlled to a desired value.

A description is given of the range of a desired thickness of the n type AlGaAs first current blocking layer 6 in the forward-mesa ridge type semiconductor laser according to the first embodiment of the invention. FIGS. 4(a) and 4(b) are graphs each showing a relation between the thickness of the n type AlGaAs first current blocking layer 6 and the reliability of the semiconductor laser. Specifically, FIG. 4(a) is a graph showing the measurement results of operating current and operating time when the thickness of the n type AlGaAs first current blocking layer 6 is 0.6 μm. FIG. 4(b) is a graph showing the measurement results of operating current and operating time when the thickness of the n type AlGaAs first current blocking layer 6 is 0.8 μm.

In FIGS. 4(a) and 4(b), using a semiconductor laser in which the n type AlGaAs first current blocking layer 6 has the Al composition detrimental to reliability of the laser in the allowable range of the Al composition, i.e., 0.80, the measurements are made at an operation temperature of 60° C. and laser output of 45 mW. As the result, the semiconductor laser in which the thickness of the n type AlGaAs first current blocking layer 6 is 0.8 μm deteriorates in 500 hours, the semiconductor laser in which the thickness of the n type AlGaAs first current blocking layer 6 is 0.6 μm reliably operates for 500 hours or more.

Thus in the n type AlGaAs first current blocking layer 6 having an Al composition of 0.60 to 0.80, by setting its thickness to not more than 0.6 μm, it is possible to prevent a decrease in reliability of the laser due to the stress applied to the active region 7. Therefore, the thickness of the n type AlGaAs current blocking layer 6 is preferably not more than 0.6 μm in view of the reliability of the laser.

In order to hold the equivalent refractive index of the active region 7 higher than that of other portions of the semiconductor laser, the n type AlGaAs first current blocking layer 6 must have a thickness greater than a certain value. In the case where the Al composition of the n type AlGaAs upper cladding layer 4 is not more than 0.55 if the Al composition of the n type AlGaAs first current blocking layer 6 is not less than 0.60, an appropriate thickness of the layer 6 is not less than 0.3 μm. Consequently, the thickness of the n type AlGaAs first current blocking layer 6 is preferably 0.3 to 0.6 μm.

A description is given of the range of a desired thickness of the n type GaAs third current blocking layer 10 in the forward-mesa ridge type semiconductor laser according to the first embodiment of the invention. FIG. 5 is a graph showing the measurement results of light output and operating current when the thickness of the n type GaAs third current blocking layer 10 is 0.3 μm.

The measurements were made using a semiconductor laser in which the n type AlGaAs first current blocking layer 6 has a thickness detrimental to the current blocking effect of the laser in the allowable range of the thickness, i.e., 0.3 μm, and the thickness of the n type GaAs third current blocking layer 10 is 0.3 μm. As a result, satisfactory values in light output and operating current characteristics were obtained. That is, the oscillating threshold was 17 mA and the operating current was 85 mA (light output was 50 mW). This shows that the current blocking effect is satisfactory at high output power operation.

Therefore, when the thickness of the n type AlGaAs first current blocking layer 6 is 0.3 to 0.6 μm, an appropriate thickness of the n type GaAs third current blocking layer 10 is not less than 0.3 μm.

Although the first current blocking layer 6 and the second current blocking layer 9 are simultaneously grown by MOCVD under the optimum growth conditions, the current blocking layers 6 and 9 may be separately grown, for example, by selective etching.

As described above, in the forward-mesa ridge type semiconductor laser of the first embodiment of the invention, the forward-mesa ridge stripe 4a is formed in the upper cladding layer 4 of the double heterojunction structure comprising AlGaAs disposed on the n type GaAs substrate 1, the n type AlGaAs first current blocking layer 6 having an Al composition of 0.70 is disposed on the front surface of the upper cladding layer 4, and the n type AlGaAs second current blocking layer 9 having an Al composition of 0.50 is disposed on the side surface of the mesa ridge stripe 4a of the upper cladding layer 4. Accordingly, the second current blocking layer 9 whose lattice constant is smaller than that of the n type GaAs substrate 1 or the upper cladding layer 4, compared with the prior art semiconductor laser, is disposed in the vicinity of the active region 7. This reduces the stress applied to the active region 7, leading to a semiconductor laser that facilitates ridge width control and burying growth and improves reliability.

In addition, in the forward-mesa ridge type semiconductor laser according to the first embodiment, the n type GaAs substrate 1 is used, the n type first current blocking layer 6 is disposed on the front surface of the upper cladding layer 4, i.e., the (001) surface, the n type second current blocking layer 9 is disposed on the side surface of the mesa ridge stripe 4a, i.e., the (111)A surface, of the upper cladding layer 4, and the n type GaAs third current blocking layer 10 is disposed on the first current blocking layer 6 on both sides of the mesa ridge stripe 4a having the second current blocking layer 9 at the side surface. Therefore, the first, second, and third current blocking layers 6, 9, and 10 are used as current blocking layers, and the first current blocking layer 6 having a large lattice constant is partly substituted for the third current blocking layer 10 having a small lattice constant as compared with the prior art. As a result, the stress applied to the active region 7 is reduced and the reliability of the semiconductor laser is further improved. Furthermore, the third current blocking layer 10 containing no Al enables an increase in the n type carrier concentration, so that the third current blocking layer 10 has a high carrier concentration of $5\times10^{18}/cm^3$, producing a satisfactory current blocking effect. Therefore, a forward-mesa ridge type semiconductor laser that exhibits satisfactory current blocking effect even at high output power operation, that operates at low driving current, and that has high reliability is obtained.

Further, in the forward-mesa ridge type semiconductor laser, the first current blocking layer 6 has a thickness of 0.3 to 0.6 μm. Therefore, the reliability of the semiconductor laser can be increased, holding a state in which the equivalent refractive index of the active region 7 is higher than that of other portions of the semiconductor laser.

Furthermore, in the forward-mesa ridge type semiconductor laser, the third current blocking layer 10 has a thickness not less than 0.3 μm. Therefore, the semiconductor laser exhibits satisfactory current blocking effect at high output power operation.

According to the first embodiment of the invention, the method of fabricating a forward-mesa ridge type semiconductor laser includes forming the double heterojunction structure comprising AlGaAs on the front surface of the n type GaAs substrate 1, i.e., the (001) surface, by MOCVD, selectively etching the upper cladding layer 4 of the double heterojunction structure to form the forward-mesa ridge stripe 4a in the <1$\bar{1}$0> direction of the upper cladding layer 4, and forming the n type AlGaAs first current blocking layer 6 having an Al composition larger than that of the upper cladding layer 4 on the (001) surface of the upper cladding layer 4 and forming the AlGaAs second current blocking layer 9 having an Al composition smaller than that of the first current blocking layer 6 and larger than that of the upper cladding layer 4 on the (111)A surface of the mesa ridge stripe 4a, by utilizing the feature that the Al compositions of the AlGaAs layers grown on the respective crystal surfaces differ depending on the directions of the crystal surfaces in the crystal growth by MOCVD. This enables simultaneously forming the first current blocking layer 6 and the second current blocking layer 9 which differ from each other in Al composition. It is possible to fabricate a forward-mesa ridge type semiconductor laser in which stress applied to an active region is reduced, without complicated processes.

What is claimed is:

1. A semiconductor laser comprising:

a first conductivity type GaAs substrate;

an AlGaAs double heterojunction structure disposed on the GaAs substrate, the double heterojunction structure including an upper cladding layer having a front surface, and a mesa ridge stripe having a side surface that makes an angle larger than 90° with the front surface of the upper cladding layer;

a first AlGaAs current blocking layer of the first conductivity type having an Al composition of 0.60 to 0.80 and disposed on the front surface of the upper cladding layer; and a second AlGaAs current blocking layer of the first conductivity type having an Al composition of 0.40 to 0.55 and disposed on the side surface of the mesa ridge stripe of the upper cladding layer adjacent the first current blocking layer, the first and second current blocking layers continuously covering all of the front and side surfaces of the upper cladding layer.

2. The semiconductor laser of claim 1 wherein the first conductivity type is n type, the first AlGaAs current blocking layer has a thickness of 0.3 to 0.6 $\mu$m on the front surface of the upper cladding layer and comprising a third n type GaAs current blocking layer disposed on the first AlGaAs current blocking layer, covering the second AlGaAs current blocking layer.

3. The semiconductor laser of claim 2 wherein the third current blocking layer has a thickness of not less than 0.3 $\mu$m.

4. The semiconductor laser of claim 1 wherein the substrate has a planar surface on which the AlGaAs double heterojunction structure is disposed and the front surface is generally parallel to the surface of the substrate.

* * * * *